(12) United States Patent
Komiyatani et al.

(10) Patent No.: US 8,597,785 B2
(45) Date of Patent: Dec. 3, 2013

(54) ADHESIVE FILM

(75) Inventors: Toshio Komiyatani, Akita (JP); Takashi Hirano, Tokyo (JP); Kenzou Maejima, Tokyo (JP); Satoru Katsurayama, Tokyo (JP); Tomoe Yamashiro, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 449 days.

(21) Appl. No.: 12/095,530

(22) PCT Filed: Sep. 28, 2007

(86) PCT No.: PCT/JP2007/001058
§ 371 (c)(1),
(2), (4) Date: Apr. 22, 2010

(87) PCT Pub. No.: WO2008/044330
PCT Pub. Date: Apr. 17, 2008

(65) Prior Publication Data
US 2010/0203307 A1      Aug. 12, 2010

(30) Foreign Application Priority Data

Oct. 3, 2006  (JP) ................................ 2006-271731

(51) Int. Cl.
*C09J 7/00* (2006.01)
*C09J 113/00* (2006.01)
*C09J 163/00* (2006.01)

(52) U.S. Cl.
USPC .............. 428/355 EP; 428/355 AC; 428/413; 525/530; 525/533; 156/330

(58) Field of Classification Search
USPC ........... 156/330; 428/355 R, 355 EP, 355 EN, 428/355 AC, 413; 523/451, 461; 525/523, 525/524, 529, 530, 531, 533
See application file for complete search history.

(56) References Cited

U.S. PATENT DOCUMENTS

| | | | |
|---|---|---|---|
| 6,328,844 B1 * | 12/2001 | Watanabe et al. ............. | 156/330 |
| 6,492,438 B1 | 12/2002 | Nomura | |
| 7,331,502 B2 | 2/2008 | Okada et al. | |
| 8,319,350 B2 * | 11/2012 | Katsurayama et al. ........ | 257/777 |
| 2003/0111519 A1 | 6/2003 | Kinney et al. | |
| 2004/0105223 A1 | 6/2004 | Okada et al. | |
| 2006/0030682 A1 * | 2/2006 | Hurley et al. ................. | 525/485 |
| 2006/0042826 A1 | 3/2006 | Kondo | |
| 2007/0073008 A1 * | 3/2007 | Hurley et al. ................. | 525/523 |
| 2009/0166897 A1 * | 7/2009 | Katsurayama et al. ........ | 257/793 |
| 2010/0078830 A1 * | 4/2010 | Katsurayama et al. ........ | 257/777 |
| 2010/0212937 A1 * | 8/2010 | Kondo et al. ................. | 174/254 |

FOREIGN PATENT DOCUMENTS

| | | |
|---|---|---|
| CN | 1498520 | 5/2004 |
| EP | 1395101 A1 | 3/2004 |
| JP | 11-54934 | 2/1999 |
| JP | 2001-288445 | 10/2001 |
| JP | 2002-033580 | 1/2002 |
| JP | 2003-128874 | 5/2003 |
| JP | 2004-244486 | 9/2004 |
| JP | 2004-291054 | 10/2004 |
| JP | 2005-501725 | 1/2005 |
| JP | 2005-194306 | 7/2005 |
| JP | 2005-277011 A | 10/2005 |
| WO | WO 2007094129 A1 * | 8/2007 ............... H05K 3/46 |

OTHER PUBLICATIONS

Extended European Search Report for corresponding EP Application No. 07827837.1-2210, Dec. 10, 2010.
Chinese Office Action for corresponding CN Application No. 200780002367.5, Jun. 22, 2011.

* cited by examiner

*Primary Examiner* — Michael J Feely
(74) *Attorney, Agent, or Firm* — Ditthavong Mori & Steiner, P.C.

(57) ABSTRACT

The present invention provides an adhesive tape comprising a flux-active compound having a carboxyl group and/or a phenolic hydroxyl group, a thermosetting resin and a film-forming resin. In the adhesive tape of the present invention, the thermosetting resin may be an epoxy resin and may contain a curing agent. The curing agent may be an imidazole compound and/or a phosphorous compound. The adhesive tape of the present invention can be used as an interlayer material for a circuit board and a multilayered flexible printed circuit board.

4 Claims, 1 Drawing Sheet

ADHESIVE FILM

TECHNICAL FIELD

The present invention relates to an adhesive tape.

BACKGROUND ART

With recent densification of electronic devices, a printed circuit board used for them has been more multi-layered and a multi-layered flexible printed circuit board has been frequently used. Such a printed circuit board is a rigid-flex printed circuit board as a composite substrate consisting of a flexible printed circuit board and a rigid printed circuit board, which has expanded in application.

According to a proposed method in the related art, a multilayered flexible printed circuit board or rigid-flex printed circuit board is prepared by alternately stacking a single-sided circuit board and an adhesive layer multiple times to form a stack, forming an interlayer-connecting through-hole in the stack, plating the interlayer-connecting through-hole and processing the outermost layer to form, for example, a circuit and the like, or by forming a hole which does not penetrate a copper foil in the insulator side of a single-sided circuit board, forming a conductor post from a metal or alloy, conducting coating of the whole surface, pressing the adhesive layer and the circuit board and repeating the process as necessary for multilayering (for example, Japanese Laid-open Patent Publication No. 11-54934).

The above manufacturing method employs an approach that as a generally used interlayer electric connecting system, a through-hole penetrating all layers is formed and each of the layers is electrically connected by plating the through-hole. However, in this electric connection system, a processing method is simple, but there are so many restrictions in circuit designing. The worst disadvantage is that since all the layers are electrically connected through the penetrating through-hole plating, the outermost layer may have through-hole plating connecting lands, which thus occupy a larger area. This makes it difficult to increase a circuit-mounting density, which may be a critical problem in component mounting or circuit wiring. Furthermore, it leads to a system incapable of achieving high-density mounting or high-density wiring which will be increasingly needed in the market.

For inexpensive manufacturing, a flexible printed circuit board is prepared using a multiple pattern where a plurality of patterns are arrayed in one sheet. Thus, a multilayered flexible printed circuit board can be inexpensively prepared through a similar manufacturing process. However, if a defective patterning is present in a sheet in this manufacturing process, a multilayered flexible printed circuit board formed by stacking the defective patterning sections is defective, leading to reduction of a process yield in a stacking step.

The biggest difference between a multilayered flexible printed circuit board or rigid-flex printed circuit board and a multilayered rigid printed circuit board is the presence of a flexible section. Preparation of such a flexible section requires removal of an outer layer for preventing stack of the flexible section or removal of an outer layer after stack, leading to reduction of the circuit board number per sheet in sheet stack. Furthermore, in a pattern design in which individual layers have different sizes, the circuit board number per one sheet is restricted to the least circuit board number of the circuit board numbers in the individual layers, leading to reduction of the circuit board number per sheet.

The latter manufacturing process has a special step of forming a hole in a receiving substrate in a conductor post by laser processing, desmearing it and forming a surface-coated opening, and establishing these techniques and improving their yields are also problems. Furthermore, as the layer number is increased, a production time and a cost is increased and a material cost for surface coating is also increased.

PATENT DOCUMENT 1: Japanese Laid-open Patent Publication No. 11-54934

DISCLOSURE OF THE INVENTION

The present invention provides an adhesive tape capable of electrically connecting layers in a circuit board by reliably fusing a solder bump.

The present invention provides an adhesive tape comprising a flux-active compound having a carboxyl group and/or a phenolic hydroxyl group; a thermosetting resin; and a film-forming resin. The above configuration allows for very strong bonding by reducing an oxide layer on the solder surface and an oxide layer on the copper foil surface as a connected surface during interlayer electrical connection by fusing a solder bump. Furthermore, an adhesive tape of the present invention eliminates the necessity of removing it by washing after solder connection, and can be directly heated to be a three-dimensionally crosslinked resin, giving a highly adhesive interlayer material between the circuit board and the multilayered flexible printed circuit board.

In the above adhesive tape, thermosetting resin may be an epoxy resin. This configuration can provide an adhesive tape excellent in curability and storage stability and in heat resistance, moisture resistance and chemical resistance of a cured product.

In the above adhesive tape, the thermosetting resin may contain a curing agent. This configuration can improve controllability of curing properties of the adhesive tape.

In the above adhesive tape, the curing agent may be an imidazole compound and/or a phosphorous compound. This configuration may improve curability of the adhesive tape.

In the adhesive tape, the film-forming resin may be a phenoxy resin or acrylic rubber. By using a phenoxy resin, fluidity of the adhesive tape before curing can be reduced to give a uniform interlayer thickness. By using an acrylic rubber, film deposition stability can be improved when preparing a film adhesive tape and adhesiveness between an adherend and an adhesive tape.

The above adhesive tape can further contain a silane coupling agent. This configuration can improve adhesiveness between an adhesive tape and an adherend.

The above adhesive tape is characterized in that when the adhesive tape is attached to the surface of an oxidized copper plate and then is reduced at 230° C. for one minute in the air, a copper-oxide reduction rate of the copper plate represented by equation (1) is 70% or more.

Copper-oxide reduction rate (%)={1−(O atom concentration after reduction)/(O atom concentration after oxidation)}×100    Equation (1)

The above adhesive tape is characterized in that when placing a tin-containing solder ball with a diameter of 500 μm on the adhesive tape and is heated at a temperature of 30° C. higher than the melting point of the solder ball for 20 sec, a solder wet spread rate represented by equation (2) is 40% or more.

Solder wet spread rate (%)=[{(diameter of a solder ball)−(solder thickness after wet spreading)}/ (diameter of a solder ball)]×100    Equation (2)

The above adhesive tape with a thickness of 100 μm has a melt viscosity of 10 to 10000 Pa·s at 223° C.

The adhesive tape is characterized in that when the adhesive tape with a thickness of 100 μm gives a minimum melt viscosity of equal to or more than 1 Pa·s and equal to or less than 10000 Pa·s as measured at 25 to 250° C. by a viscoelasticity measuring instrument in a temperature-increase rate of 10° C./min and a frequency of 0.1 Hz.

According to the present invention, there is provided an adhesive tape capable of electrically connecting layers in a circuit board by reliably fusing a solder bump.

BEST MODE FOR CARRYING OUT THE INVENTION

There will be detailed preferable embodiments of an adhesive tape of the present invention.

An adhesive tape of the present invention contains a flux-active compound having a carboxyl group and/or a phenolic hydroxyl group; a thermosetting resin; and a film-forming resin. There will be described the individual components.

A flux-active compound having a carboxyl group and/or a phenolic hydroxyl group used in the present invention refers to a compound having at least one carboxyl group and/or phenolic hydroxyl group in one molecule, which may be present as a liquid or solid.

Examples of a flux-active compound having a carboxyl group include aliphatic acid anhydrides, alicyclic acid anhydrides, aromatic acid anhydrides, aliphatic carboxylic acids and aromatic carboxylic acids. Examples of a flux-active compound having a phenolic hydroxyl group include phenols.

Examples of an aliphatic acid anhydride include succinic anhydride, polyadipic anhydride, polyazelaic anhydride and polysebacic anhydride.

Examples of an alicyclic acid anhydride include methyltetrahydrophthalic anhydride, methylhexahydrophthalic anhydride, methylhimic anhydride, hexahydrophthalic anhydride, tetrahydrophthalic anhydride, trialkyltetrahydrophthalic anhydride, methylcyclohexenedicarboxylic anhydride or the like.

Examples of an aromatic acid anhydride include phthalic anhydride, trimellitic anhydride, pyromellitic anhydride, benzophenonetetracarboxylic anhydride, ethyleneglycol bistrimelliate, glycerin tristrimellitate or the like.

Examples of an aliphatic carboxylic acid include compounds represented by formula (3).

$$HOOC\text{---}(CH_2)_n\text{---}COON \quad (3)$$

wherein n is an integer of equal to or more than 0 and equal to or less than 20.

In the light of flux activity, outgassing during adhesion, and balance between an elastic modulus after curing an adhesive tape and a glass-transition temperature, "n" in formula (3) is preferably equal to or more than 3 and equal to or less than 10. When n is 3 or more, increase in an elastic modulus after curing the adhesive tape can be inhibited to improve its adhesiveness to an adherend. When n is 10 or less, reduction in an elastic modulus can be inhibited to further improve connection reliability.

Examples of a compound represented by formula (3) include glutaric acid ($HOOC\text{---}(CH_2)_3\text{---}COON$; n=3), adipic acid ($HOOC\text{---}(CH_2)_4\text{---}COON$; n=4), pimelic acid ($HOOC\text{---}(CH_2)_5\text{---}COON$; n=5), sebacic acid ($HOOC\text{---}(CH_2)_8\text{---}COOH$; n=8) and $HOOC\text{---}(CH_2)_{10}\text{---}COOH$ (n=10).

Other examples of an aliphatic carboxylic acid include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid or the like.

Examples of an aromatic carboxylic acid include benzoic acid, phthalic acid, isophthalic acid, terephthalic acid, hemimellitic acid, trimellitic acid, trimesic acid, mellophanic acid, prehnitic acid, pyromellitic acid, mellitic acid, toluic acid, xylic acid, hemellitic acid, mesitylene acid, prehnitic acid, toluic acid, cinnamic acid, salicylic acid, 2,3-dihyroxybenzoic acid, 2,4-dihydroxybenzoic acid, gentisic acid (2,5-dihyroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid, phenolphthalin, diphenolic acid or the like.

Examples of a flux-active compound having a phenolic hydroxyl group include monomers having a phenolic hydroxyl group such as phenol, o-cresol, 2,6-xylenol, p-cresol, m-cresol, o-ethylphenol, 2,4-xylenol, 2,5-xylenol, m-ethylphenol, 2,3-xylenol, mesytol, 3,5-xylenol, p-tert-butylphenol, catechol, p-tert-amylphenol, resorcinol, p-octylphenol, p-phenylphenol, bisphenol-A, bisphenol-F, bisphenol-AF, biphenol, diallylbisphenol-F, diallylbisphenol-A, trisphenol and tetrakisphenol; phenol novolac resins; o-cresol novolac resins; bisphenol-F novolac resins; bisphenol-A novolac resins and the like.

Since a flux-active compound is three-dimensionally incorporated in a reaction with a thermosetting resin such as an epoxy resin, it is preferably a compound having at least two phenolic hydroxyl groups capable of being added to an epoxy resin and at least one carboxyl group directly attached to an aromatic moiety and exhibiting flux effect to a metal oxide layer in one molecule. Examples of such a compound include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid) or the like; naphthoic acid derivatives such as 1,4-dihydroxy-2-naphthoic acid, 3,5-dihydroxy-2-naphthoic acid, 3,7-dihydroxy-2-naphthoic acid and the like; phenolphthalin, diphenol acid or the like.

These flux-active compounds may be used alone or in combination of two or more.

A blending rate of the flux-active compound is 1% by weight or more, preferably 5% by weight or more to the total amount of the compositions of an adhesive tape in the light of improving flux activity. A residual flux-active compound not being involved in a reaction with a thermosetting resin may cause migration. Therefore, for avoiding a residual flux-active compound not being involved in a reaction with a thermosetting resin, a blending rate of the flux-active compound is 30% by weight or less, preferably 25% by weight or less. Furthermore, when the rate is within the above range, an oxide layer in a copper foil surface can be reduced to give a very strong and favorable bonding.

Examples of a thermosetting resin used in the present invention include epoxy resins, oxetane resins, phenol resins, (meth)acrylate resins, unsaturated polyester resins, diallyl phthalate resins, maleimide resins and the like. Among others, epoxy resins are suitably used, which are excellent in curability and storage stability, and heat resistance, moisture resistance and chemical resistance of a cured product.

The epoxy resin used may be an epoxy resin which is either a solid or a liquid at room temperature. Furthermore, the resin may contain an epoxy resin which is a solid at room temperature and an epoxy resin which is a liquid at room temperature. Thus, freedom in designing melting behavior of the resin can be further improved.

Examples of an epoxy resin which is a solid at room temperature include, but not limited to, bisphenol-A type epoxy resins, bisphenol-S type epoxy resins, phenol novolac type epoxy resins, cresol novolac type epoxy resins, glycidylamine type epoxy resins, glycidyl ester type epoxy resins, trifunctional epoxy resins, tetrafunctional epoxy resins and the like. More specifically, it may contain a solid trifunctional epoxy resin and a cresol novolac type epoxy resin.

An epoxy resin which is a liquid at room temperature may be a bisphenol-A type epoxy resin or a bisphenol-F type epoxy resin. These may be used in combination.

A blending rate of these thermosetting resins is preferably equal to or more than 25% by the weight and equal to or less than 75% by weight, more preferably equal to or more than 45% by the weight and equal to or less than 70% by weight to the total amount of the compositions of the adhesive tape. The rate within the above range may provide excellent curability and allows for designing favorable melting behavior.

A thermosetting resin may contain a curing agent. Examples of a curing agent include phenols, amines and thiols. When an epoxy resin is used as a thermosetting resin, phenols are suitably used in the light of good reactivity to the epoxy resin, a low dimensional change during curing and proper physical properties after curing (for example, heat resistance, moisture resistance or the like).

A phenol is preferably, but not limited to, bi- or more functional in the light of physical properties of an adhesive tape after curing. For example, it may be selected from bisphenol-A, tetramethylbisphenol-A, diallylbisphenol-A, biphenol, bisphenol-F, diallylbisphenol-F, trisphenol, tetrakisphenol, phenol novolacs, cresol novolacs and the like, but in the light of melt viscosity, reactivity with an epoxy resin and post-curing physical properties, phenol novolacs and cresol novolacs may be suitably used.

When using a phenol novolac as a curing agent, its blending rate is, for example, 5% by weight or more, preferably 10% by weight or more to the total amount of the components of the adhesive tape in the light of ensuring resin curing. A residual phenol novolac not being involved in a reaction with an epoxy resin may cause migration. Therefore, for avoiding a residual material, it is 30% by weight or less, preferably 25% by weight or less.

When the thermosetting resin is an epoxy resin, a blending rate of the phenol novolac resin may be defined as an equivalent ratio to the epoxy resin. Specifically, an equivalent ratio of a phenol novolac to an epoxy resin is equal to or more than 0.5 and equal to or less than 1.2, preferably equal to or more than 0.6 and equal to or less than 1.1, more preferably equal to or more than 0.7 and equal to or less than 0.98. By adjusting an equivalent ratio of a phenol novolac resin to an epoxy resin to 0.5 or more, heat resistance and moisture resistance after curing can be ensured, and by adjusting the equivalent ratio to 1.2 or less, the amount of a residual phenol novolac resin not being involved in a reaction with an epoxy resin after curing can be reduced, resulting in excellent migration resistance.

Other examples of a curing agent include imidazole compounds and phosphorous compounds. An imidazole compound used may be, for example, an imidazole compound having a melting point of 150° C. or higher. If a melting point of the imidazole compound is too low, an oxide layer on a solder bump is removed, so that an adhesive tape is cured before metal-joining of a solder bump with an electrode, leading to concernedly unstable connection and deteriorated storage stability of the adhesive tape. Therefore a melting point of the imidazole is preferably 150° C. or higher. Examples of an imidazole compound having a melting point of 150° C. or higher include 2-phenylhydroxyimidazole, 2-phenyl-4-methylhydroxyimidazole, 2-phenyl-4-methylimidazole and the like. There are no particular restrictions to the upper limit of a melting point of the imidazole compound, which can be appropriately selected, for example, depending on a bonding temperature of an adhesive tape.

When using an imidazole compound as a curing agent, its blending rate is, for example, equal to or more than 0.005% by weight and equal to or less than 10% by weight, preferably equal to or more than 0.01% by weight and equal to or less than 5% by weight to the total amount of the components of the adhesive tape. By adjusting a blending rate of the imidazole compound to 0.005% by weight or more, it can more effectively functions as a curing catalyst for a thermosetting resin to improve curability of an adhesive tape. Furthermore, adjusting a blending rate of the imidazole compound to 10% by weight or less, a melt viscosity of a resin is not so high at a melting temperature of the solder, resulting in a favorable solder connection structure. In addition, storage stability of the adhesive tape can be further improved.

Examples of a phosphorous compound include phosphorous compounds such as triphenyl phosphine; molecular compounds of a tetra-substituted phosphonium and a polyfunctional phenol compound; a molecular compound of a tetra-substituted phosphonium, a proton donor and a trialkoxysilane compound, or the like. Among these, a molecular compound of a tetra-substituted phosphonium and a polyfunctional phenol compound and a molecular compound of a tetra-substituted phosphonium, a proton donor and trialkoxysilane compound are particularly preferable, which are more excellent in quick curability of an adhesive film, corrosivity of a semiconductor element to an aluminum pad and furthermore storage stability of an adhesive film.

A molecular compound of a tetra-substituted phosphonium and a polyfunctional phenol compound or a molecular compound of a tetra-substituted phosphonium, a proton donor and a trialkoxysilane compound is not a simple mixture of these compounds, but a molecular compound having a structure such as a salt structure or a supramolecular structure.

A tetra-substituted phosphonium is preferably a tetra-substituted phosphonium in which a phosphorous atom is four-coordinated by an alkyl group or an aromatic compound in the light of balance between curability and storage stability of an adhesive film.

There are no particular restrictions to substituents in a tetra-substituted phosphonium, and the substituents may be the same or different, including substituted or unsubstituted aryl or alkyl groups. A tetra-substituted phosphonium ion having a substituted or unsubstituted aryl or alkyl group is preferable because it is stable to heating or hydrolysis. Specific examples of a tetra-substituted phosphonium include tetraphenylphosphonium, tetratolylphosphonium, tetraethyl phenylphosphonium, tetramethoxyphenylphosphonium, tetranaphthylphosphonium, tetrabenzylphosphonium, ethyltriphenylphosphonium, n-butyltriphenylphosphonium, 2-hydroxyethyltriphenylphosphonium, trimethylphenylphosphonium, methyldiethylphenylphosphonium, methyldiallylphenylphosphonium, tetra-n-butylphosphonium and the like. Among these, tetraphenyl phosphonium is preferable in the light of balance between rapid curability and storage stability of an adhesive film.

A polyfunctional phenol compound in a molecular compound of a tetra-substituted phosphonium and a polyfunctional phenol compound refers to a phenol compound where at least one hydroxy group of phenolic hydroxyl groups loses hydrogen to form a phenoxide. Specific examples include hydroxybenzene compounds, biphenol compounds, bisphenol compounds, hydroxynaphthalene compounds, phenol novolac resins, phenol aralkyl resins or the like.

Examples of such a polyfunctional phenol compound include bisphenols such as bis(4-hydroxy-3,5-dimethylphenyl)methane (common name: tetramethylbisphenol-F), 4,4'-sulfonyldiphenol and 4,4'-isopropylidenediphenol (common name: bisphenol-A), bis(4-hydroxyphenyl)methane, bis(2-hydroxyphenyl)methane and (2-hydroxyphenyl)(4-hydroxyphenyl)methane, as well as a mixture of bis(4-hydroxyphenyl)methane and bis(2-hydroxyphenyl)methane and (2-hydroxyphenyl)(4-hydroxyphenyl)methane (for example, bisphenol-F-D from Honshu Chemical Industry Co., Ltd.); dihydroxybenzenes such as 1,2-benzenediol, 1,3-benzenediol and 1,4-benzenediol; trihydroxybenzenes such as 1,2,4-benzenetriol; dihydroxynaphthalenes such as 1,2-dihydroxynaphthalene and 1,6-dihydroxynaphthalene and their isomers; and biphenols such as 2,2'-biphenol and 4,4'-biphenol and their isomers. Among others, 1,2-dihydroxynaphthalene and 4,4'-sulfonyldiphenol are preferable because they have excellent balance between rapid curability and storage stability.

Examples of a proton donor in a molecular compound of a tetra-substituted phosphonium, a proton donor and a trialkoxysilane compound include, but not limited to, aliphatic hydroxy compounds such as 1,2-cyclohexanediol, 1,2-ethanediol, 3,4-dihydroxy-3-cyclobutene-1,2-dione and glycerin; aliphatic carboxylic acid compounds such as glycolic acid and thioacetic acid; aromatic hydroxy compounds such as benzoin, catechol, pyrogallol, propyl gallate, tannic acid, 2-hydroxyaniline, 2-hydroxybenzyl alcohol, 1,2-dihydroxynaphthalene and 2,3-dihydroxynaphthalene; and aromatic carboxylic acid compounds such as salicylic acid, 1-hydroxy-2-naphthoic acid and 3-hydroxy-2-naphthoic acid.

Among these proton donors, an aromatic dihydroxy compound is more preferable in the light of stability of a phosphorous compound.

Examples of an aromatic dihydroxy compound include aromatic hydroxy compounds having an aromatic-ring-containing organic group such as catechol, pyrogallol, propyl gallate, 1,2-dihydroxynaphthalene, 2,3-dihydroxynaphthalene, 1,8-dihydroxynaphthalene, 2,2'-biphenol, tannic acid; and dihydroxy or the like compounds having a heterocycle-containing organic group such as 2,3-dihydroxypyridine and 2,3-dihydroxyquinoxaline. Among these, catechol, 2,2'-biphenol, 1,2-dihydroxynaphthalene, 2,3-dihydroxynaphthalene are particularly preferable.

Examples of a trialkoxysilane compound include trialkoxysilane compounds having a substituent containing a substituted or unsubstituted aromatic ring; trialkoxysilane compounds having a substituted or unsubstituted aliphatic group; trialkoxysilane compounds having a substituent containing a substituted or unsubstituted heterocycle or the like.

Examples of an aromatic-ring-containing group include phenyl, pentafluorophenyl, benzyl, methoxyphenyl, tolyl, fluorophenyl, chlorophenyl, bromophenyl, nitrophenyl, cyanophenyl, aminophenyl, aminophenoxy, N-phenylanilino, N-phenylanilinopropyl, phenoxypropyl, phenylethynyl, indenyl, naphthyl and biphenyl.

Examples of an aliphatic group include methyl, ethyl, propyl, butyl, hexyl, glycidyloxypropyl, mercaptopropyl, aminopropyl, anilinopropyl, butyl, hexyl, octyl, chloromethyl, bromomethyl, chloropropyl, cyanopropyl, diethylamino, vinyl, allyl, methacryloxymethyl, methacryloxypropyl, pentadienyl, bicycloheptyl, bicycloheptenyl and ethynyl.

Examples of a heterocycle-containing group include pyridyl, pyrrolinyl, imidazolyl, indonyl, triazolyl, benzotriazolyl, carbazolyl, triazinyl, piperidnyl, quinolyl, morpholinyl, furyl, furfuryl and thienyl. Among these, vinyl, phenyl, naphthyl and glycidyloxypropyl are more preferable in the light of stability of a silicate anion in a latent catalyst.

Examples of a trialkoxysilane compound having a group containing a substituted or unsubstituted aromatic ring include phenyltrimethoxysilane, phenyltriethoxysilane, pentafluorophenyltriethoxysilane, 1-naphthyltrimethoxysilane and (N-phenylaminopropyl)trimethoxysilane.

Examples of a trialkoxysilane compound having a substituted or unsubstituted aliphatic group include methyltrimethoxysilane, methyltriethoxysilane, ethyltrimethoxysilane, ethyltriethoxysilane, hexyltrimethoxysilane, vinyltrimethoxysilane, hexyltriethoxysilane, 3-glycidyloxypropyltrimethoxysilane, 3-mercaptopropyltrimethoxysilane and 3-aminopropyltrimethoxysilane.

Examples of a trialkoxysilane compound having a group containing a substituted or unsubstituted heterocycle include 2-(trimethoxysilylethyl)pyridine and N-(3-trimethoxysilylpropyl)pyrrole. Examples of a substituent in the aliphatic group include glycidyl, mercapto and amino, and examples of a substituent in the aromatic ring and the heterocycle include methyl, ethyl, hydroxy and amino.

When a phosphorous compound is used as a curing agent, its blending rate is, for example, equal to or more than 0.005% by weight and equal to or less than 10% by weight, preferably equal to or more than 0.01% by weight and equal to or less than 5% by weight to the total amount of the components of an adhesive tape. By adjusting a blending rate of a phosphorous compound to 0.005% by weight or more, the thermosetting resin can further effectively function as a curing catalyst, resulting in improving curability of the adhesive tape. Furthermore, by adjusting a blending rate of the phosphorous compound to 10% by weight or less, a melt viscosity of a resin is not so high at a melting temperature of the solder, resulting in a favorable solder connection structure. In addition, storage stability of the adhesive tape can be further improved.

These curing agents may be used alone or in combination of two or more.

Examples of a film-forming resin include phenoxy resins, polyester resins, polyurethane resins, polyimide resins, siloxane-modified polyimide resins, polybutadiene, polypropylene, styrene-butadiene-styrenecopolymers, styrene-ethylene-butylene-styrene copolymers, polyacetal resins, polyvinylbutyral resins, polyvinylacetal resins, butyl rubbers, chloroprene rubbers, polyamide resins, acrylonitrile-butadiene copolymers, acrylonitrile-butadiene-acrylic acid copolymers, acrylonitrile-butadiene-styrene copolymers, polyvinyl acetate, Nylons and acrylic rubbers. These may be used alone or in combination of two or more.

When using a phenoxy resin as a film-forming resin, the phenoxy resin preferably has a number average molecular weight of 5000 to 15000. By using such a phenoxy resin, fluidity of an adhesive tape before curing can be reduced to make an interlayer thickness uniform. A phenoxy resin framework may be, but not limited to, a bisphenol-A type, bisphenol-F type or biphenyl framework type. A phenoxy resin with a saturated water absorption of 1% or less is preferable because foaming or detachment can be prevented at an elevated temperature during joining or solder mounting.

Furthermore, by way of improving adhesiveness and compatibility with another resin, a resin having nitrile, epoxy, hydroxy and carboxyl can be used as the above film-forming resin, and such a resin may be, for example, an acrylic rubber.

When using an acrylic rubber as a film-forming resin, film-deposition stability can be improved during preparing a film adhesive tape. Furthermore, an elastic modulus of an adhesive tape can be reduced and a residual stress between an adherend and an adhesive tape can be reduced, to improve adhesiveness to the adherend.

The acrylic rubber preferably is a (meth)acrylate ester copolymer containing a monomer unit having, for example, epoxy, hydroxy, carboxyl or nitrile. Thus, it can further improve, for example, adhesiveness of a rear surface of a semiconductor element and a coating material on a semiconductor element to an adherend. Examples of a monomer used in such a (meth)acrylate ester copolymer include glycidyl (meth)acrylates having a glycidyl group, (meth)acrylates having a hydroxy group, (meth)acrylates having a carboxyl group, (meth)acrylonitriles having a nitrile group and the like.

Among these, it is particularly preferable to use a (meth)acrylate ester copolymer containing a monomer unit having a carboxyl group. Thus, curing of an adhesive film is further accelerated and adhesiveness to an adherend can be improved.

When using a (meth)acrylate ester copolymer containing a monomer unit having a carboxyl group, a content of the monomer unit having a carboxyl group in a copolymer is, for example, 0.5% by weight or more, preferably 1% by weight or more to the total amount of the (meth)acrylate ester copolymer in the light of further improving adhesiveness to an adherend. A content of the monomer unit having a carboxyl group is, for example, 10% by weight or less, preferably 5% by weight or less to the total amount of the (meth)acrylate ester copolymer in the light of further improving storage stability of an adhesive film.

A weight average molecular weight of the (meth)acrylate ester copolymer is, for example, equal to or more than 1,000 and equal to or less than 1,000,000, preferably equal to or more than 3,000 and equal to or less than 800,000. The molecular weight within the above range allows for further improvement of deposition properties of an adhesive film and for ensuring fluidity during adhesion.

A weight average molecular weight of the (meth)acrylate ester copolymer can be determined by, for example, gel permeation chromatography (GPC), under the measurement conditions, for example, chromatograph: high-speed GPC SC-8020 (manufactured by Tosoh Corporation), column: TSK-GEL GMHXL-L, temperature: 40° C. and solvent: tetrahydrofuran.

A glass-transition temperature of the (meth)acrylate ester copolymer is, for example, 0° C. or higher, preferably 5° C. or higher in the light of preventing an adhesive film from being too adhesive to further improve workability. Furthermore, a glass-transition temperature of the (meth)acrylate ester copolymer is, for example, 30° C. or lower, preferably 20° C. or lower in the light of further improving adhesiveness at a low temperature.

A glass-transition temperature of the (meth)acrylate ester copolymer can be determined, for example, from an inflection point obtained by pulling it while raising a temperature at a temperature-increase rate of 5° C./min from −65° C. under a constant load (10 mN) using, for example, a thermomechanical property analyzer (manufactured by Seiko Instruments Inc., TMA/SS6100).

A blending rate of the film-forming resin may be, for example, equal to or more than 5% by weight and equal to or less than 45% by weight to the total amount of the components of an adhesive tape. When the film-forming resin is contained within the above range, deterioration in deposition properties can be prevented and increase in an elastic modulus of the adhesive tape after curing is prevented, so that adhesiveness to an adherend can be further improved. Furthermore, the rate within the above range allows for prevention of increase in a melt viscosity of the adhesive tape.

An adhesive tape of the present invention may further contain a silane coupling agent. By using a silane coupling agent, the adhesive tape can have further improved adhesiveness to an adherend. Examples of the silane coupling agent include epoxysilane coupling agents, aromatic-containing aminosilane coupling agents and the like. These may be used alone or in combination of two or more. A blending rate of the silane coupling agent may be, for example, 0.01 to 5% by weight to the total amount of the components of an adhesive tape.

Furthermore, an adhesive tape of the present invention may contain components other than those described above. For example, a variety of additives may be appropriately added for improving various properties of a resin such as compatibility, stability, workability or the like.

There will be described a process for manufacturing an adhesive tape of the present invention. The adhesive tape can be prepared by blending a flux-active compound, a thermosetting resin and a film-forming resin, applying the mixture to a release liner such as a polyester sheet, and drying the sheet at a given temperature.

In one embodiment of the present invention, an adhesive tape is characterized in that when an adhesive tape is attached to the surface of an oxidized copper plate and is reduced at 230° C. for one minute in the air, a copper-oxide reduction rate of the copper plate represented by equation (1) is 70% or more. The flux-active compound is capable of reducing an oxide layer on the electrode surface in the circuit board and thus removing the oxide layer. A reduction rate for a copper oxide adequate to remove the oxide layer for preventing defective connection from occurring is 70% or more. Furthermore, in the light of improvement in a bonding probability and bond reliability under various circumstances after bonding, a reduction of a copper oxide is preferably 75% or more, more preferably 80% or more.

Next, there will be described the conditions of reduction of the copper oxide (230° C., one minute). Since reduction of the copper oxide in the flux-active compound is initiated at a temperature higher than the melting point of the flux-active compound, a temperature of reduction of the copper oxide can be appropriately adjusted, depending on the flux-active compound. On the other hand, for the interlayer connection in a circuit board, a lead-free solder such as Sn/3.5Ag (221° C.), Sn-3.0Ag-0.5Cu (217° C.), Sn-58Bi (139° C.) or the like is used and most of these have a melting point of 230° C. or lower. Therefore, in this embodiment of the present invention, a reduction temperature for a copper oxide is 230° C. A reduction time is one minute in the light of a time for melting of the flux-active compound for wetting the surface of the copper oxide and initiating reduction, and furthermore variation in reduction.

A copper-oxide (CuO) reduction rate is represented by equation (1) and can be determined by the following measuring method.

Definition $$\text{Copper-oxide reduction rate (\%)} = \{1 - (\text{O atom concentration after reduction})/(\text{O atom concentration after oxidation})\} \times 100 \quad \text{Equation (1)}$$

Measuring Method (1) A copper plate with a thickness of 70 μm (manufactured by Mitsui Mining And Smelting Company, Limited, 3EC-3, thickness: 2 to 3 μm) is soft-etched with a commercially available etchant.

(2) The soft-etched copper plate is oxidized in the air in an oven at 220° C. for 30 min.

(3) An adhesive tape with a thickness of 25 μm is attached to the surface of the oxidized copper plate, and is subjected to reduction in the air at 230° C. for one minute.

(4) Within one minute after the reduction of Step (3), the adhesive tape components remaining on the surface of the reduced copper plate are removed by acetone.

(5) The copper plate after removing the resin components is immediately transferred to a vacuum desiccator and vacuum dried for drying the copper plate surface. The copper plate is stored under vacuum until ESCA measurement.

(6) The surface of the thus oxidized copper plate and the reduced copper plate to a depth of 40 Å are removed by plasma treatment. Then, Cu and O atom concentrations are determined by ESCA (manufactured by ULVAC-PHI Inc.). The plasma treatment and the ESCA measurement are conducted under a vacuum atmosphere. Removal of the surface of the copper plate to a depth of 40 Å by plasma treatment is for eliminating influence of an oxidized surface during handling for measurement.

The measurement conditions of ESCA used are as follows:
(i) Photoelectron take-off angle: 45 deg
(ii) X-ray source: Alkα-ray (monochrome)
(iii) Analysis range: 0.8 mmΦ

(7) A reduction rate of the copper oxide is calculated using equation (1).

In one embodiment of the present invention, an adhesive tape is characterized in that when placing a tin-containing solder ball with a diameter of 500 μm on the adhesive tape and is heated at a temperature of 30° C. higher than the melting point of the solder ball for 20 sec, a solder wet spread rate represented by equation (2) is 40% or more. The flux-active compound is capable of reducing an oxide layer in a solder bump, reducing a surface tension of the solder and improving solder wettability. When using a solder bump for metal bonding of a circuit board, the larger a wet spread rate of the solder is, the stronger metal-metal bond is, resulting in increase in bond strength. A solder wet spread rate adequate for preventing defective bonding is 40% or more. In the light of improvement in a bonding probability and bonding reliability under various atmosphere, a solder wet spread rate is preferably 45% or more, more preferably 50% or more.

Next, the conditions for measuring a solder wet spread rate (heating at a temperature of 30° C. higher than a melting point of a solder ball for 20 sec) will be described. The temperature must be at least higher than a melting point of a lead-free solder ball such as Sn/Ag (221° C.), Sn-3.0Ag-0.5Cu (217° C.), Sn-58Bi (139° C.) or the like. Furthermore, for reducing variation in wet spreading of the solder ball, the tape is heated at a temperature of 30° C. higher than a melting point of the solder ball in an embodiment of the present invention. A heating time is 20 sec in the light of a time for melting of the flux-active compound for moving to the solder ball surface and wet spreading of the solder ball, and furthermore variation in wet spreading of the solder.

A solder wet spread rate is represented by equation (2) and can be determined by the following measuring method.

Definition $$\text{Solder wet spread rate (\%)} = [\{(\text{diameter of a solder ball}) - (\text{solder thickness after wet spreading})\} / (\text{diameter of a solder ball})] \times 100 \quad \text{Equation (2)}$$

Measuring Method (1) An adhesive tape with a thickness of 15 μm is attached to a bare Cu plate (manufactured by Hirai Seimitsu Kogyo Co., Ltd.).

(2) The following solder balls with a diameter of 500 μm are gently placed on the adhesive tape.
(i) Sn/63Pb (melting point: 183° C., manufactured by Senju Metal Industry Co. Ltd.)
(ii) M31 (Sn/Ag/Cu, melting point: 217° C., manufactured by Senju Metal Industry Co. Ltd.)
(iii) L20 (Sn/Bi, melting point: 138° C., manufactured by Senju Metal Industry Co. Ltd.)

(3) In accordance with ASTM B 545, a hot plate is heated to a temperature of 30° C. higher than a melting point of each solder and on the hot plate, the above sample is heated for 20 sec.

(4) A height of the wet-spreading solder ball on the bare Cu plate is measured.

(5) Using equation (2), a solder wet spread rate is calculated.

In one embodiment of the present invention, an adhesive tape with a thickness of 100 μm has a melt viscosity of equal to or more than 10 Pa·s and equal to or less than 10000 Pa·s at 223° C. A melt viscosity of 10 Pa·s or more can prevent deterioration of adhesion reliability due to protrusion of an adhesive tape from an adherend during heating and contamination of surrounding due to the protrusion. In addition, foaming and defects such as unfilling of an upper and a lower circuit boards can be prevented. Furthermore, it can prevent a problem that excessive wet spreading of a solder causes short circuit between adjacent electrodes. A melt viscosity of 10000 Pa·s or less allow for prevention of defective binding due to elimination of a resin between a solder bump and a circuit board electrode during metal binding of the solder bump and the circuit board electrode. A melt viscosity is preferably equal to or more than 100 Pa·s and equal to or less than 3000 Pa·s, particularly preferably equal to or more than 300 Pa and equal to or less than 1500 Pa·s.

In one embodiment of the present invention, an adhesive tape is characterized in that when the adhesive tape with a thickness of 100 μm gives a minimum melt viscosity of equal to or more than 1 Pa·s and equal to or less than 10000 Pa·s as measured at 25 to 250° C. by a viscoelasticity measuring instrument in a temperature-increase rate of 10° C./min and a frequency of 0.1 Hz. The term "minimum melt viscosity" as used herein refers to a minimum melt viscosity as determined under the above measuring conditions in a temperature range of 25 to 250° C. A minimum melt viscosity of 1 Pa·s or more allows for preventing deterioration in adhesion reliability due to protrusion of the adhesive tape during heating irrespective of the type of the solder bump and furthermore preventing contamination of the surrounding due to the protrusion. In addition, foaming and defects such as unfilling of an upper and a lower circuit boards can be prevented. Furthermore, it can prevent a problem that excessive wet spreading of a solder causes short circuit between adjacent electrodes. A minimum melt viscosity of 10000 Pa·s or less allow for prevention of defective binding due to elimination of a resin between a solder bump and a circuit board electrode during metal binding of the solder bump and the circuit board electrode. A minimum melt viscosity is preferably equal to or more than 3 Pa·s and equal to or less than 3000 Pa·s, particularly preferably equal to or more than 5 Pa·s and equal to or less than 500 Pa·s.

A melt viscosity of an adhesive tape can be determined by the following measuring method.

Measuring method

An adhesive tape with a thickness of 100 μm is subjected to measurement by stress detection under a constant strain using a viscoelasticity measuring instrument (Rheo Stress RS-10, manufactured by HAAKE Inc.) in a temperature-increase rate of 10° C./min and a frequency of 0.1 Hz, and a viscosity at an atmospheric temperature of 223° C. which is a melting point of Sn/3.5Ag is defined as a measured melt viscosity at 223° C. A minimum melt viscosity in the range of 25° C. to 250° C. is defined as a measured minimum melt viscosity.

An adhesive tape of the present invention meets one, preferably two, more preferably all of a copper-oxide reduction rate, a solder wet spread rate and a melt viscosity within the above ranges.

In a preferable embodiment of the present invention, an adhesive tape contains, but not limited to, the following components. Contents of the indicated components are expressed in % by weight on the basis of the total amount of the components.

(i) Phenoxy resin: 5 to 30% by weight
(ii) Liquid bisphenol-A type epoxy resin: 40 to 70% by weight
(iii) Phenol novolac resin: 10 to 25% by weight
(iv) Flux-active compound having a phenolic hydroxyl group: 5 to 20% by weight.

In a preferable embodiment of the present invention, an adhesive tape contains the following components.

(i) Phenoxy resin: 5 to 30% by weight
(ii) Liquid bisphenol-A type epoxy resin: 40 to 70% by weight
(iii) Phenol novolac resin: 10 to 25% by weight
(iv) Flux-active compound having a carboxyl group: 5 to 20% by weight.

In a preferable embodiment of the present invention, an adhesive tape contains the following components.

(i) Phenoxy resin: 5 to 30% by weight (ii) Liquid bisphenol-A type epoxy resin: 40 to 70% by weight (iii) Phenol novolac resin: 10 to 25% by weight (iv) Flux-active compound having a phenolic hydroxyl group and a carboxyl group: 5 to 20% by weight.

In a preferable embodiment of the present invention, an adhesive tape contains the following components.

(i) Phenoxy resin: 5 to 30% by weight (ii) Liquid bisphenol-A type epoxy resin: 40 to 70% by weight (iii) Imidazole: 0.01 to 5% by weight (iv) Flux-active compound having a phenolic hydroxyl group and a carboxyl group: 5 to 20% by weight.

In a preferable embodiment of the present invention, an adhesive tape contains the following components.

(i) Acrylic rubber: 15 to 45% by weight (ii) Solid trifunctional epoxy resin: 15 to 60% by weight (iii) Bisphenol-F type epoxy resin: 9 to 10% by weight (iv) Phenol novolac resin: 10 to 25% by weight (v) Imidazole: 0.01 to 5% by weight (vi) Flux-active compound having a carboxyl group: 5 to 20% by weight (vii) Silane coupling agent: 0.01 to 1% by weight.

In a preferable embodiment of the present invention, an adhesive tape contains the following components.

(i) Acrylic rubber: 15 to 45% by weight (ii) Solid trifunctional epoxy resin: 15 to 60% by weight (iii) Bisphenol-F type epoxy resin: 9 to 10% by weight (iv) Phenol novolac resin: 5 to 25% by weight (v) Phosphorous-containing compound: 0.01 to 5% by weight (vi) Flux-active compound having a phenolic hydroxyl group and a carboxyl group: 5 to 20% by weight.

In a preferable embodiment of the present invention, an adhesive tape contains the following components.

(i) Acrylic rubber: 15 to 45% by weight (ii) Solid trifunctional epoxy resin: 15 to 60% by weight (iii) Phenol novolac resin: 5 to 25% by weight (iv) Imidazole: 0.01 to 5% by weight (v) Flux-active compound having a phenolic hydroxyl group and a carboxyl group: 5 to 20% by weight.

With the above composition, balance between reduction of a thermal melt viscosity and curability can be further improved, so that interlayer connection of a circuit board by melting a solder bump can be ensured. In the above composition example, a content of the acrylic rubber (i) can be adjusted to 15 to 45% by weight, to achieve a balance between adhesive tape adhesiveness and thermal melt viscosity. In addition, with a composition of a solid trifunctional epoxy resin (ii), a phenol novolac resin (iii) and imidazole (iv) within the above range, a melt viscosity of the adhesive tape before curing can be reduced to give a favorable solder connection structure and furthermore to provide proper curability. With a content of the flux-active compound having a phenolic hydroxyl group and a carboxyl group (v) within the above range, both of flux activity during solder binding and ion migration properties after curing the adhesive tape can be satisfied.

In a preferable embodiment of the present invention, an adhesive tape contains the following components.

(i) Acrylic rubber: 15 to 45% by weight (ii) Solid trifunctional epoxy resin: 15 to 60% by weight (iii) Phenol novolac resin: 5 to 25% by weight (iv) Phosphorous-containing compound: 0.01 to 5% by weight (v) Flux-active compound having a phenolic hydroxyl group and a carboxyl group: 5 to 20% by weight.

With the above composition, balance between reduction of a thermal melt viscosity and curability can be further improved, so that interlayer connection of a circuit board by melting a solder bump can be ensured. In the above composition example, a content of the acrylic rubber (i) can be adjusted to 15 to 45% by weight, to achieve a balance between adhesive tape adhesiveness and thermal melt viscosity. In addition, with a composition of a solid trifunctional epoxy resin (ii), a phenol novolac resin (iii) and a phosphorous-containing compound (iv) within the above range, a melt viscosity of the adhesive tape before curing can be reduced to give a favorable solder connection structure and furthermore to satisfy both proper curability and storage stability. With a content of the flux-active compound having a phenolic hydroxyl group and a carboxyl group (v) within the above range, both of flux activity during solder binding and ion migration properties after curing the adhesive tape can be satisfied.

Figure 1:
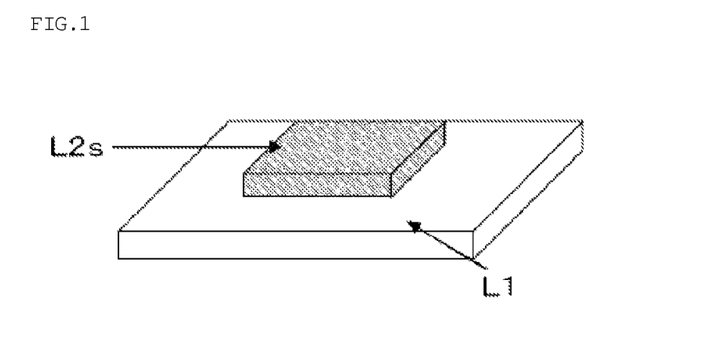
FIG. 1 shows a multilayered circuit board in which an adhesive tape is employed.
Figure 2:
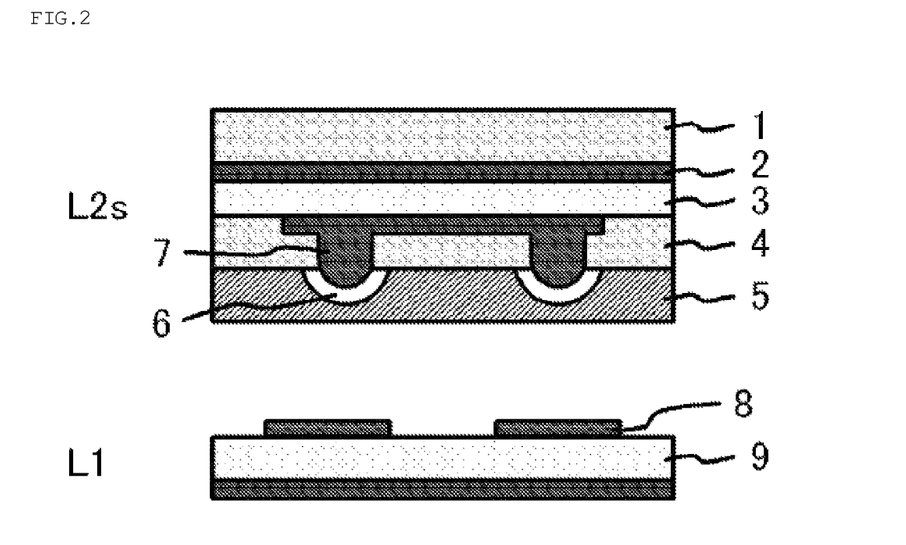
FIG. 2 is a schematic view illustrating a connecting section in the multilayered circuit board in FIG. 1.

An adhesive tape is used for preparing a stack as shown in, for example, FIG. 1. FIG. 1 shows a stack where a circuit board to be connected and a single-sided circuit board with a via are bonded through an adhesive tape. FIG. 2 is a schematic view showing a connecting section in the stack of FIG. 1. In an upper substrate L2s is formed a copper foil 2 covering a built-up insulating layer 1 and a core-material layer 3 covering the copper foil 2. A built-up insulating layer 4 has a via post 7, which is covered by a solder plated layer 6. An adhesive tape 5 is applied such that it covers the built-up insulating layer 4 and the solder plated layer 6. On the other hand, in a lower substrate L1, separate pads 8 are formed on a core-material layer 9. The upper substrate L2s and the lower substrate L1 are heated and pressed to be mutually bonded to give a stack.

There have been described the present invention with reference to the preferable embodiments, but the present invention is not limited to these embodiments.

EXAMPLES

There will be described Examples. The present invention is not limited to the examples.

Examples 1 to 33

Preparation of an Adhesive Tape

The components listed in Table 1 were dissolved in an aromatic hydrocarbon solvent such as toluene, xylene and the like, an organic ester solvent such as ethyl acetate, butyl acetate and the like, or an organic ketone solvent such as acetone, methyl ethyl ketone and the like, to give a varnish, which is applied to a polyester sheet and dried at a temperature at which the above solvent vaporized, to give an adhesive tape. The contents in the table are expressed as % by weight to the total amount of the components.

Comparative Examples 1 to 2

The components listed in Table 2 were used as described for Examples 1 to 33 to give an adhesive tape.

Determination of a Reduction Rate of Copper Oxide

Each of the adhesive tapes of Examples 1 to 33 and Comparative Examples 1 and 2 was used for determining a reduction rate of copper oxide by the above measuring method. The results are shown in Tables 1 and 2.

Determination of a Solder Wet Spread Rate

Each of the adhesive tapes of Examples 1 to 33 was used for determining a solder wet spread rate by the above measuring method. The results are shown in Table 1.

Determination of a Melt Viscosity

Each of the adhesive tapes of Examples 1 to 29 and Comparative Examples 1 and 2 was used for determining a melt viscosity by the above measuring method. The results are shown in Tables 1 and 2. Furthermore, each of the adhesive tapes of Examples 30 to 33 was used for determining a minimum adhesion viscosity in accordance with the above measuring method. The results are shown in Table 1.

Determination of a Resin Flow Coefficient

A resin flow coefficient was determined for each of the adhesive tapes of Examples 1 to 33 and Comparative Examples 1 and 2.

A resin flow coefficient is represented by equation (4) and can be determined as described below.

Definition $$\text{Resin flow coefficient} = (\text{Area after heating})/(\text{Area before heating}) \quad \text{Equation (4)}$$

Measuring method

A 5 mm×5 mm×13 μm (thickness) adhesive tape was applied on a 30 mm×40 mm×1.1 μm (thickness) glass substrate. Next, another 30 mm×40 mm×1.1 μm (thickness) glass substrate was disposed and heated at 1.0 MPa and a heating temperature of 250° C. for 30 sec. From a ratio of an area before heating to an area after heating, a resin flow coefficient was calculated. The results are shown in Tables 1 and 2.

Determination of a Connection Rate

Each of the adhesive tapes of Examples 1 to 33 and Comparative Examples 1 and 2 was used for determining a connection rate.

Measuring Method (1) Preparation of a Single-Sided Circuit Board with a Via

Two-layer double-sided plate consisting a copper foil with a thickness of 12 μm and a pre-preg as a supporting substrate (thickness: 200 μm) was etched to form an interconnection pattern. Built-up layers with a thickness of 40 μm were formed on both sides, a built-up opening with a diameter of 70 μm was formed by $CO_2$ laser from the interconnection pattern side and then the plate was desmeared using an aqueous solution of potassium permanganate. The built-up opening was electrolytically copper-plated to form a copper post (diameter: 70 μm) with a height of 15 μm from the surface of the built-up layer, and then the copper post was solder-plated (Sn/3.5Ag) to a thickness of 15 μm, to form a conductor post. Then, the plate was cut into 25 mm×25 mm pieces, to give a single-sided circuit board with a via.

(2) Preparation of a Circuit Board to be Connected

Two-layer double-sided plate consisting a copper foil with a thickness of 12 μm and a pre-preg as a supporting substrate (thickness: 400 μm) was etched to form an interconnection pattern. Then, the plate was cut into 40 mm×40 mm pieces to give a circuit board to be connected. It has a pad with a diameter of 400 μm which is to be bonded to the conductor post in the single-sided circuit board with a via.

(3) Preparation of a Multilayered Circuit Board

Both sides of the single-sided circuit board with a via and the circuit board to be connected were layed up using a jig with a pin guide for alignment. Then, they are pressed at 260° C. and 0.5M Pa for 60 sec to initiate solder-melting bonding of the conductor post having a solder plate with the pad in the inner-layer circuit board for interlayer bonding. Furthermore, for curing the adhesive tape, the product was subjected to heat history at 180° C. for 60 min to give a multilayered circuit board.

(4) Determination of a Connection Rate

The multilayered circuit board obtained by the above method was used for determining an interlayer connection resistance by a digital multimeter at 20 points. Measurement was conducted after preparation of the multilayered circuit board and after 1000 temperature cycles of −65° C. for one hour and 150° C. for one hour. The results are shown in Tables 1 and 2.

Criteria open circle (○): 20/20 conductive
open triangle (Δ): 18 to 20/20 conductive
cross (x): 18 or less/20 conductive Measurement of Resin Protrusion Each of the adhesive tapes of Examples 1 to 33 and Comparative Examples 1 and 2 was used for measuring a resin protrusion.

Measuring Method

As described for the above method for measuring a connection rate, a multilayered circuit board was prepared and a resin amount protruding from the multilayered circuit board was observed. The results are shown in Tables 1 and 2.

Criteria open circle (○): No resin protrusions are observed.
open triangle (Δ): Although a resin protrusion is observed, no protrusions bridging between layers in the multilayered circuit board are observed.
cross (x): A resin bridges between layers in the multilayered circuit board.

Measurement of a Cross Section of a Bonding Area

Each of the adhesive tapes of Examples 1 to 33 and Comparative Examples 1 and 2 was used for observing a cross section of a bonding area.

Measuring Method

As described for the above method for measuring a connection rate, a multilayered circuit board was prepared and embedded in an epoxy resin cured product, and its cross section was polished and 10 sites in the interlayer connection area were observed by SEM (scanning electron microscopy). The cross section was observed after preparing the multilayered circuit board and after 1000 temperature cycles of −65° C. for one hour and 150° C. for one hour. The results are shown in Tables 1 and 2.

Criteria open circle (○): No change from the initial state
open triangle (Δ): Deformation or partial initiation of cracks compared to the initial state
cross (x): Defective opening (for example, cracks in a bonding area) or short circuit (bridging in a bonding area)

TABLE 1

| | Component | Structure etc. | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Ex. 15 | Ex. 16 |
|---|---|---|---|---|---|---|---|---|---|---|---|---|---|---|---|---|---|---|
| Film-forming component | High heat-resistant phenoxy resin | YL-6954, Japan Epoxy Resins Co., Ltd. | 20 | 20 | 20 | 20 | 20 | 20 | 20 | 20 | 20 | 20 | 20 | 20 | 20 | 20 | 5 | 40 |
| | Silicon-modified polyimide | SIM(1) | | | | | | | | | | | | | | | | |
| | | SIM(2) | | | | | | | | | | | | | | | | |
| | Acrylic rubber | (Butyl acrylate)-(Ethyl acrylate)-(Acrylonitrile) = 30 mol %/30 mol %/40 mol %, MW = 850,000 | | | | | | | | | | | | | | | | |
| Hardening resin | Curing component | Epoxy resin | Epiclon 840S, Dainippon Ink And Chemicals, Inc. Liquid bis-A type epoxy resin, epoxy equivalent = 180 | 40 | 50 | 50 | 50 | 50 | 50 | 50 | 50 | 50 | 50 | 50 | 50 | 50 | 50 | 60 | 40 |
| | Epoxy resin | NC6000, Nippon Kayaku Co., Ltd. Solid trifunctional epoxy resin, softening point = 60° C. | | | | | | | | | | | | | | | | |
| | Epoxy resin | EOCN-1020-80, Nippon Kayaku Co., Ltd. Cresol novolac type epoxy resin, softening point = 80° C. | | | | | | | | | | | | | | | | |
| | Epoxy resin | RE-304S, Nippon Kayaku Co., Ltd. Liquid bis-F type epoxy resin, epoxy equivalent = 170 | | | | | | | | | | | | | | | | |
| | Curing agent | Phenol novolac | PR-53647, Sumitomo Bakelite Co., Ltd. softening point = 95° C., OH equivalent = 104 | 20 | 20 | 25 | 25 | 25 | 25 | 25 | 25 | 25 | 25 | 25 | 25 | 25 | 25 | 30 | 20 |
| | Phenol novolac | PR-HF-3, Sumitomo Bakelite Co., Ltd. softening point = 90° C., OH equivalent = 105 | | | | | | | | | | | | | | | | |
| | Imidazole | 2PHZ-PW, Shikoku Chemicals Corp. 2-Phenyl-4,5-dihydroxy methylimidazole | | | | | | | | | | | | | | | | |
| | Imidazole | 2P4MHZ, Shikoku Chemicals Corp. 2-Phenyl-4-methyl-5-hydroxyimidazole | | | | | | | | | | | | | | | | |

TABLE 1-continued

| | Component | Structure etc. | Ex. 17 | Ex. 18 | Ex. 19 | Ex. 20 | Ex. 21 | Ex. 22 | Ex. 23 | Ex. 24 | Ex. 25 | Ex. 26 | Ex. 27 | Ex. 28 | Ex. 29 | Ex. 30 | Ex. 31 | Ex. 32 | Ex. 33 |
|---|---|---|---|---|---|---|---|---|---|---|---|---|---|---|---|---|---|---|---|
| Flux compound | Phosphorous-containing compound | Molecular compound of tetraphenylphosphine/phenyltrimethoxysilane/2,3-dihydroxynaphthalene | | | | | | | | | | | | | | | | | |
| | Catechol | | | | | | 5 | | | | | | | | | | | | |
| | o,o-Bisphenol F | | | | | | | 5 | | | | | | | | | | | |
| | Hexahydrophthalic anhydride | | | | | | | | 5 | | | | | | | | | | |
| | Benzophenone tetracarboxylic anhydride | | | | | | | | | 5 | | | | | | | | | |
| | Lauric acid | | | | | | | | | | 5 | | | | | | | | |
| | Phthalic acid | | | | | | | | | | | 5 | | | | | | | |
| | Sebacic acid | | | | | | | | | | | | 5 | | | | | | |
| | Adipic acid | | | | | | | | | | | | | 5 | | | | | |
| | Salicylic acid | | | | | | | | | | | | | | 5 | | | | |
| | Gentisic acid | | | | | | | | | | | | | | | 5 | | | |
| | 1,4-Dihydroxy-2-naphthoic acid | | | | | | | | | | | | | | | | 5 | | |
| | Phenolphthalein | | | | | | | | | | | | | | | | | 5 | 5 |
| Additive | Tackifier | | 20 | 20 | 10 | | | | | | | | | | | | | | |
| | Silane coupling agent | KBM-403E, Epoxy silane, Shin-Etsu Chemical Co., Ltd. | | | 5 | | | | | | | | | | | | | | |
| | Silane coupling agent | KBM-573, Aromatic secondary aminosilane, Shin-Etsu Chemical Co., Ltd. | | | | | | | | | | | | | | | | | |
| Copper-oxide (CuO) reduction rate (%) | | | 86 | 75 | 70 | 75 | 75 | 75 | 75 | 75 | 75 | 80 | 75 | 75 | 80 | 75 | 75 | 70 | 75 |
| Solder wet spread rate (%) | SnPb | | 55 | 52 | 50 | 45 | 47 | 55 | 52 | 52 | 55 | 52 | 55 | 55 | 55 | 52 | 52 | 55 | 60 |
| | SnAgCu | | 52 | 50 | 45 | 44 | 43 | 53 | 48 | 47 | 50 | 49 | 50 | 50 | 50 | 45 | 45 | 51 | 57 |
| | SnBi | | 54 | 52 | 50 | 47 | 45 | 55 | 50 | 50 | 52 | 52 | 52 | 52 | 54 | 50 | 50 | 54 | 60 |
| Melt viscosity of an adhesive resin (Pa·s) | | | 1000 | 900 | 800 | 150 | 150 | 200 | 200 | 900 | 900 | 900 | 900 | 800 | 800 | 800 | 800 | 100 | 2000 |
| Minimum melt viscosity (Pa·s) and a temperature at the time of minimum melt viscosity (°C) | Minimum melt viscosity at the time of the minimum melt viscosity | | 3.8 | 4.2 | 4.2 | 4.6 | 4.4 | 4.4 | 4.2 | 4.8 | 4.2 | 4.4 | 4.4 | 4.4 | 4.0 | 4.4 | 4.2 | 5.0 | 4.0 |
| Resin flow | | | o | o | o | o | o | o | o | o | o | o | o | o | o | o | o | o | o |
| Connection rate (%) | Initial | | o | o | o | o | o | o | o | o | o | o | o | o | o | o | o | o | o |
| | After 1000 temperature cycles | | o | o | o | o | o | o | o | o | o | o | o | o | o | o | o | o | o |
| Resin protrusion | | | o | o | o | o | o | o | o | o | o | o | o | o | o | o | o | o | o |
| Bonding-area cross section | Initial | | o | o | o | o | o | o | o | o | o | o | o | o | o | o | o | o | o |
| | After 1000 temperature cycles | | o | o | o | o | o | o | o | o | o | o | o | o | o | o | o | o | o |

| | Component | Structure etc. | Ex. 17 | Ex. 18 | Ex. 19 | Ex. 20 | Ex. 21 | Ex. 22 | Ex. 23 | Ex. 24 | Ex. 25 | Ex. 26 | Ex. 27 | Ex. 28 | Ex. 29 | Ex. 30 | Ex. 31 | Ex. 32 | Ex. 33 |
|---|---|---|---|---|---|---|---|---|---|---|---|---|---|---|---|---|---|---|---|
| Film-forming component | High heat-resistant phenoxy resin | YL-6954, Japan Epoxy Resins Co., Ltd. | 20 | 20 | 20 | | | | | | | | | | | | 25 | 25 | 25 |

TABLE 1-continued

| Category | Component | Description | | | | | | | | | | | | | | | |
|---|---|---|---|---|---|---|---|---|---|---|---|---|---|---|---|---|---|
| Hardening resin | Curing component | SIM(1) | | | | | | | | | | | | | | | |
| | | Acrylic rubber (Butyl acrylate)-(Ethyl acrylate)-(Acrylonitrile) = 30 mol %/30 mol %/40 mol %, MW = 850,000 | | | | | | | | | | | | | | 45 | 45 |
| | | SIM(2) | 25 | 25 | 25 | 25 | 15 | 45 | 25 | 25 | 25 | 25 | 25 | 35 | 35 | | |
| | Epoxy resin | Epiclon 840S, Dainippon Ink And Chemicals, Inc. Liquid bis-A type epoxy resin, epoxy equivalent = 180 | | | 70 | 70 | | | | | | | | | | | |
| | Epoxy resin | NC6000, Nippon Kayaku Co., Ltd. Solid trifunctional epoxy resin, softening point = 60° C. | 50 | 25 | 25 | 25 | 25 | 30 | 15 | 25 | 25 | 50 | 25 | 55 | 55 | | |
| | Epoxy resin | EOCN-1020-80, Nippon Kayaku Co., Ltd. Cresol novolac type epoxy resin, softening point = 80° C. | | 15 | 10 | 5 | 20 | 5 | 15 | 15 | | 15 | | | | | |
| | Epoxy resin | RE-304S, Nippon Kayaku Co., Ltd. Liquid bis-F type epoxy resin, epoxy equivalent = 170 | | 9.5 | 9.5 | 9.5 | 9.5 | 9.5 | 9.5 | 9.5 | 9.5 | 9.5 | | | | | |
| | Curing agent | PR-53647, Sumitomo Bakelite Co., Ltd. Phenol novolac softening point = 95° C., OH equivalent = 104 | 25 | | | | | | | | | | | | | | |
| | | PR-HF-3, Sumitomo Bakelite Co., Ltd. Phenol novolac softening point = 90° C., OH equivalent = 105 | | 20 | 20 | 20 | 20 | 20 | 20 | 20 | 10 | 20 | | 15 | 15 | 15 | |
| | | 2PHZ-PW, Shikoku Chemicals Corp. Imidazole 2-Phenyl-4,5-dihydroxymethylimidazole | 5 | | | | | | | | | 5 | 5 | | | | |
| | | 2P4MHZ, Shikoku Chemicals Corp. Imidazole 2-Phenyl-4-methyl-5-hydroxyimidazole | | 5 | | | | | | | | | | 0.5 | 0.5 | 0.1 | |
| | | Molecular compound of tetraphenylphosphine/ phenyltrimethoxysilane/2,3-dihydroxynaphthalene Phosphorous-containing compound | | | | | | | | | | | 5 | | | | |
| Flux compound | | Catechol | | | | | | | | | | | | | | | |
| | | o,o-Bisphenol F | | | | | | | | | | | | | | | |
| | | Hexahydro-phthalic anhydride | | | | | | | | | | | | | | | |
| | | Benzophenone tetracarboxylic anhydride | | | | | | | | | | | | | | | |
| | | Lauric acid | 5 | 5 | 10 | 15 | 5 | 5 | | | | | | 5 | 5 | 5 | 3 |
| | | Phthalic acid | | | | | | | | | | | | | | | |
| | | Sebacic acid | | | | | | | | | | | | | | | |

TABLE 1-continued

| Additive | Adipic acid | | | | | | | | | | | | | | | | | |
|---|---|---|---|---|---|---|---|---|---|---|---|---|---|---|---|---|---|---|
| | Salicylic acid | 5 | | | | | | | | | | | | | | | | |
| | Gentisic acid | | 5 | 5 | | | | | | | | | | | | | | |
| | 1,4-Dihydroxy-2-naphthoic acid | | | | | | | | | 5 | | | | | | | | |
| | Phenolphthalin | | | | 0.1 | 0.1 | 0.1 | 0.1 | 0.1 | 0.1 | 0.1 | 0.1 | 0.1 | 0.1 | 0.1 | 15 | 15 | 15 |
| Tackifier | | | | | | | | | | | | | | | 0.5 | 0.5 | 0.5 | 0.5 | 0.5 |
| Silane coupling agent | KBM-403E, Epoxy silane, Shin-Etsu Chemical Co., Ltd. | | | | 0.4 | 0.4 | 0.4 | 0.4 | 0.4 | 0.4 | 0.4 | 0.4 | 0.4 | | | | | |
| Silane coupling agent | KBM-573, Aromatic secondary aminosilane, Shin-Etsu Chemical Co., Ltd. | | | | | | | | | | | | | 0.4 | 0.4 | | | |
| Copper-oxide (CuO) reduction rate (%) | | 75 | 80 | 80 | 80 | 85 | 90 | 80 | 80 | 80 | 75 | 75 | 75 | 75 | 70 | 68 | 77 | 72 |
| Solder wet spread rate (%) | SnPb | 58 | 57 | 57 | 70 | 72 | 75 | 65 | 65 | 60 | 60 | 65 | 62 | 65 | 55 | 52 | 58 | 56 |
| | SnAgCu | 53 | 54 | 53 | 65 | 66 | 68 | 60 | 60 | 55 | 65 | 65 | 63 | 63 | 52 | 55 | 56 | 55 |
| | SnBi | 55 | 55 | 55 | 68 | 68 | 65 | 65 | 62 | 60 | 58 | 62 | 60 | 60 | 54 | 54 | 59 | 56 |
| Melt viscosity of an adhesive resin (Pa·s) | | 400 | 500 | 500 | 400 | 360 | 300 | 150 | 700 | 500 | 450 | 430 | 300 | 350 | 350 | 3000 | | |
| Minimum melt viscosity (Pa·s) | | | | | | | | | | | | | | | | | 8 | 22 |
| Temperature at the time of the minimum melt viscosity (°C) | | | | | | | | | | | | | | | 150 | 115 | 184 | 137 |
| Resin flow | | 3.2 | 6.2 | 6.0 | 5.3 | 5.2 | 5.1 | 6.2 | 3.3 | 4.9 | 5.4 | 5.3 | 5.0 | 5.2 | 3.8 | 3.5 | 4.7 | 4.5 |
| Connection rate (%) | Initial | ○ | ○ | ○ | ○ | ○ | ○ | ○ | ○ | ○ | ○ | ○ | ○ | ○ | ○ | ○ | ○ | ○ |
| | After 1000 temperature cycles | ○ | ○ | ○ | ○ | ○ | ○ | ○ | ○ | ○ | ○ | ○ | ○ | ○ | ○ | ○ | ○ | ○ |
| Resin protrusion | Initial | ○ | ○ | ○ | ○ | ○ | ○ | ○ | ○ | ○ | ○ | ○ | ○ | ○ | ○ | ○ | ○ | ○ |
| | After 1000 temperature cycles | ○ | ○ | ○ | ○ | ○ | ○ | ○ | ○ | ○ | ○ | ○ | ○ | ○ | ○ | ○ | ○ | ○ |
| Bonding area cross section | | ○ | ○ | ○ | ○ | ○ | ○ | ○ | ○ | ○ | ○ | ○ | ○ | ○ | ○ | ○ | ○ | ○ |

TABLE 2

| | Component | Structure etc. | Comp. Ex. 1 | Comp. Ex. 2 |
|---|---|---|---|---|
| Film-forming component | High heat-resistant phenoxy resin | YL-6954, Japan Epoxy Resins Co., Ltd. | 20 | 80 |
| | Silicon-modified polyimide | SIM(1) | | |
| | | SIM(2) | | |
| | Acrylic rubber | (Butyl acrylate)-(Ethyl acrylate)-(Acrylonitrile) = 30 mol %/30mol %/40 mol %, MW = 850,000 | | |
| Hardening resin — Curing component | Epoxy resin | Epiclon 840S, Dainippon Ink And Chemicals, Inc., Liquid bis-A type epoxy resin, epoxy equivalent = 180 | 50 | |
| | Epoxy resin | NC6000, Nippon Kayaku Co., Ltd., Solid trifunctional epoxy resin, softening point = 60° C. | | |
| | Epoxy resin | EOCN-1020-80, Nippon Kayaku Co., Ltd., Cresol novolac type epoxy resin, softening = 80° C. | | |
| | Epoxy resin | RE-304S, Nippon Kayaku Co., Ltd., Liquid bis-F type epoxy resin, epoxy equivalent = 170 | | |
| Curing agent | Phenol novolac | PR-53647, Sumitomo Bakelite Co., Ltd., softening point = 95° C., OH equivalent = 104 | 30 | |
| | Phenol novolac | PR-HF-3, Sumitomo Bakelite Co., Ltd., softening point = 90° C., OH equivalent = 105 | | |
| | Imidazole | 2PHZ-PW, Shikoku Chemicals Corp., 2-Phenyl-4,5-dihydroxymethylimidazole | | |
| | Imidazole | 2P4MHZ, Shikoku Chemicals Corp., 2-Phenyl-4-methyl-5-hydroxyimidazole | | |
| | Phosphorous-containing compound | Molecular compound of tetraphenylphosphine/ phenyltrimethoxysilane/2,3-dihydroxynaphthalene | | |
| Flux compound | Catechol | | | |
| | o,o-Bisphenol F | | | |
| | hexahydrophthalic anhydride | | | |
| | Benzophenone tetracarboxylic anhydride | | | |
| | Lauric acid | | | |
| | Phthalic acid | | | |
| | Sebacic acid | | | |
| | Adipic acid | | | |
| | Salicylic acid | | | |
| | Gentisic acid | | | |
| | 1,4-Dihydroxy-2-naphthoic acid | | | |
| | Phenolphthalin | | | 20 |
| Additive — Tackifier | Silane coupling agent | KBM-403E, Epoxy silane, Shin-Etsu Chemical Co., Ltd. | | |
| | Silane coupling agent | KBM-573, Aromatic secondary aminosilane, Shin-Etsu Chemical Co., Ltd. | | |
| Copper-oxide (CuO) reduction rate (%) | | | 0 | 65 |
| Solder wet spread rate (%) | | SnPb | 8 | 45 |
| | | SnAgCu | 4 | 29 |
| | | SnBi | 7 | 40 |
| Melt viscosity of an adhesive resin (Pa·s) | | | 700 | 6000 |
| Resin flow | | | 4.5 | 4.8 |
| Connection rate (%) | | Initial | x | Δ |
| | | After 1000 temperature cycles | x | x |
| | | Resin protrusion | o | o |
| Bonding-area cross section | | Initial | x | Δ |
| | | After 1000 temperature cycles | x | x |

The above results indicate that any of the adhesive tapes of Examples 1 to 29 had a copper-oxide reduction rate of 70% or more, a solder wet spread rate of 40% or more and a melt viscosity of equal to or more than 100 Pa·s and equal to or less than 10000 Pa·s. Any of the adhesive tapes of Examples 30 to 33 had a minimum melt viscosity of equal to or more than 1 Pa·s and equal to or less than 10000 Pa·s. These gave satisfactory results in all measurement results for a resin flow coefficient, a connection rate, resin protrusion and a bonding-area cross section.

The invention claimed is:

1. An adhesive film comprising a flux-active compound having a carboxyl group and/or a phenolic hydroxyl group, an epoxy-resin, a phenol novolac curing agent, and a film-forming resin;
   wherein the flux-active compound is present in an amount of from 1% by weight or more and 30% by weight or less based on the total weight of the adhesive film;
   wherein the phenol novolac curing agent is present in an amount of from 5% by weight or more and 30% by weight or less based on the total weight of the adhesive film;
   wherein said film-forming resin comprises acrylic rubber having at least one functional group selected from the group consisting of a nitrile group, an epoxy group, a hydroxy group, and a carboxyl group,
   wherein said adhesive film has a copper-oxide reduction rate of 70% or more, the copper-oxide reduction rate being represented by equation (1), and being measured by attaching said adhesive film to the surface of a copper plate which is oxidized and by reducing the copper plate at 230° C. for one minute in the air, copper-oxide reduction rate (%)={1−(O atom concentration of the copper plate after reduction)/(O atom concentration of the copper plate after oxidation)}×100        Equation (1), and wherein said adhesive film has a solder wet spread rate of 40% or more, the solder wet spread rate being represented by equation (2), and being measured by placing a solder ball which consists of Sn-3.0Ag-0.5Cu and which has a diameter of 500 μm over said adhesive film, by heating the solder ball at a temperature of 30° C. higher than a melting point of said solder ball for 20 seconds following ASTM B 545 to wet-spread the solder ball, and by measuring a thickness of the solder ball after the wet-spreading, solder wet spread rate (%)=[{(the diameter of a solder ball)−(the thickness of the solder ball after the wet-spreading)}/(the diameter of the solder ball)]×100        Equation (2).

2. The adhesive film according to claim 1, further comprising an imidazole compound.

3. The adhesive film according to claim 1, further comprising a silane coupling agent.

4. The adhesive film according to claim 1, wherein said adhesive film when with a thickness of 100 μm has a melt viscosity of equal to or more than 10 Pa·s and equal to or less than 10000 Pa·s at 223° C.

\* \* \* \* \*